United States Patent
Solmeyer et al.

(10) Patent No.: US 11,156,675 B2
(45) Date of Patent: Oct. 26, 2021

(54) MAGNETOMETER DEVICE BASED ON ELECTRICAL PUMPING IN NITROGEN-VACANCY CENTERS IN DIAMOND

(71) Applicant: Honeywell International Inc., Morris Plains, NJ (US)

(72) Inventors: Neal Eldrich Solmeyer, Edina, MN (US); Steven Tin, Edina, MN (US); Matthew Robbins, Minneapolis, MN (US); Eugene Freeman, Eden Prairie, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/810,594

(22) Filed: Mar. 5, 2020

(65) Prior Publication Data

US 2021/0278484 A1   Sep. 9, 2021

(51) Int. Cl.
*G01R 33/00* (2006.01)
*G01R 33/032* (2006.01)
*H01L 29/16* (2006.01)

(52) U.S. Cl.
CPC ........ *G01R 33/032* (2013.01); *H01L 29/1602* (2013.01)

(58) Field of Classification Search
None
See application file for complete search history.

(56) References Cited

U.S. PATENT DOCUMENTS

| 9,910,105 | B2 | 3/2018 | Boesch et al. |
| 2008/0094722 | A1 | 4/2008 | Dahl et al. |
| 2017/0328965 | A1* | 11/2017 | Hruby ............. G01R 33/60 |
| 2017/0370979 | A1 | 12/2017 | Braje et al. |
| 2018/0321333 | A1 | 11/2018 | Cochrane |

FOREIGN PATENT DOCUMENTS

| WO | 2018155504 A1 | 8/2018 |
| WO | 2019040434 A2 | 2/2019 |

OTHER PUBLICATIONS

Cochrane et al., "Vectorized magnetometer for space applications using electrical readout of atomic scale defects in silicon carbide", Scientific Reports, Nov. 28, 2016, pp. 1-13, www.nature.com/scientificreports.

(Continued)

*Primary Examiner* — Jas A Sanghera
(74) *Attorney, Agent, or Firm* — Fogg & Powers LLC (57) ABSTRACT

A magnetometer comprises a diode structure including a diamond material having free electrons and free charge carriers. An electrical circuit is coupled to the diode structure and is operative to apply a forward bias voltage to the diode structure. An optical detector is operative to collect and measure an electroluminescence produced by the diode structure after the forward bias voltage is applied to the diode structure. A processor is coupled to the optical detector and is operative to determine a magnetic field based on the measured electroluminescence produced by the diode structure.

20 Claims, 7 Drawing Sheets

(56) References Cited

OTHER PUBLICATIONS

Doi et al., "Deterministic Electrical Charge-State Initialization of Single Nitrogen-Vacancy Center in Diamond", Physical Review X 4(1), 2014, pp. 1-11, American Physical Society.

Fedyanin et al., "Ultrabright single-photon source on diamond with electrical pumping", New J. Phys. 18, 073012, Feb. 13, 2016, pp. 1-27.

Tegetmeyer, "Luminescence properties of SiV-centers in diamond diodes", Jan. 30, 2018, pp. 1-143, UniFreiburg.

* cited by examiner

MAGNETOMETER DEVICE BASED ON ELECTRICAL PUMPING IN NITROGEN-VACANCY CENTERS IN DIAMOND

BACKGROUND

High sensitivity commercial magnetometers often involve complex setups, such as cryogenics for superconducting quantum interference devices (SQUIDS), or optical pumping setups for optical magnetometers. Magnetometers based on the nitrogen-vacancy (NV) center in diamond offer the potential for integration into electrical or photonic circuits, but current designs rely on optically pumping the defect center. In addition to being complicated, optical pumping can be inefficient.

SUMMARY

A magnetometer comprises a diode structure including a diamond material having free electrons and free charge carriers. An electrical circuit is coupled to the diode structure and is operative to apply a forward bias voltage to the diode structure. An optical detector is operative to collect and measure an electroluminescence produced by the diode structure after the forward bias voltage is applied to the diode structure. A processor is coupled to the optical detector and is operative to determine a magnetic field based on the measured electroluminescence produced by the diode structure.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Magnetometer devices and methods, based on nitrogen-vacancy (NV) centers in diamond, are described herein. Traditionally, light at 532 nm has been used to pump the NV centers in diamond in order to produce a magnetically sensitive fluorescence. The present approach replaces the traditional optical pumping method with a method of pumping that relies on electrical injection of charge carriers.

In order to inject charge carriers into the present devices, the diamond needs to be made into a diode structure. The charge carriers are injected into the diamond diode structure so that the defect NV centers trap holes (positive charge carriers), and emit light in a process known as electroluminescence. The defect NV centers also retrap electrons to form a closed cycle. This capture process can be implemented to be magnetic field dependent, so that the magnetic field can be found from the electroluminescence.

In one embodiment, a p-i-n diode structure fabricated in the diamond is employed. When this structure is excited electrically, electroluminescence is exhibited when unpaired electrons and holes recombine with the defect NV centers. The recombination rate is dependent on the spin state of the defect, and can hence be sensitive to the magnetic field in the presence of resonant microwave fields. In other embodiments, the measurement can be performed without the application of a microwave field, such as by looking at near zero field, or looking at near level crossings.

In one implementation, an NV diamond magnetometer can be produced where an ensemble of NV centers is electrically driven and read out optically. This approach can lead to higher sensitivities with small numbers of NV centers.

In other implementations, the current of the diode structure can be measured. This current is sensitive to the recombination current, hence, the population in the ground state, and therefore the magnetic field.

The present approach can be used to manufacture very low size, weight, and power (SWAP) devices, without the need for lasers, and can have many sensors patterned in arrays that can be electrically switched. A pump based on electrical pumping can be used, which allows for the production of very low power consumption, highly compact, and high sensitivity magnetometers.

Further details of various embodiments are described hereafter with reference to the drawings.

Figure 1:
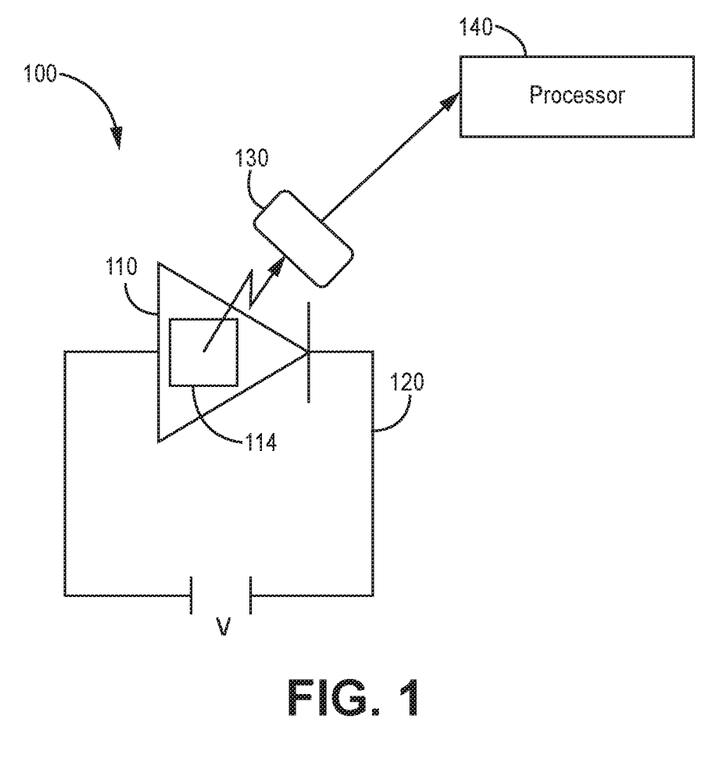
FIG. 1 is a schematic diagram of a magnetometer device, according to one embodiment.

FIG. 1 is a schematic diagram of a magnetometer device 100, according to one embodiment. The magnetometer device 100 comprises a diode structure 110 that includes a diamond material 114 having free electrons and free charge carriers. In one example embodiment, diode structure 110 includes a p-i-n diode structure in diamond material 114. The p-i-n diode structure is described in further detail hereafter.

An electrical circuit 120 is coupled to diode structure 110 and is operative to apply a forward bias voltage to diode structure 110. An optical detector 130, such as a photodetector, is operative to measure electroluminescence produced by diode structure 110 after the forward bias voltage is applied to diode structure 110. A processor 140 is coupled to optical detector 130 and is operative to determine a magnetic field based on the measured electroluminescence produced by diode structure 110.

During operation of magnetometer device 100, upon application of a forward bias voltage by electrical circuit 120, the charge carriers flow into an intrinsic region of diamond material 114. In the diamond lattice of diode structure 110, nitrogen-vacancy centers exist in several charge states, either being previously grown or implanted in the diamond. The negatively charged defect center (NV$^-$) traps a charge carrier (hole), and is transformed into a neutral defect center, NV$^0$, in a highly excited state. This state decays and emits an electroluminescent photon which is collected with the photodetector. A corresponding electrical signal is then sent from the photodetector to the processor to determine the magnetic field at a particular location.

Figure 2:
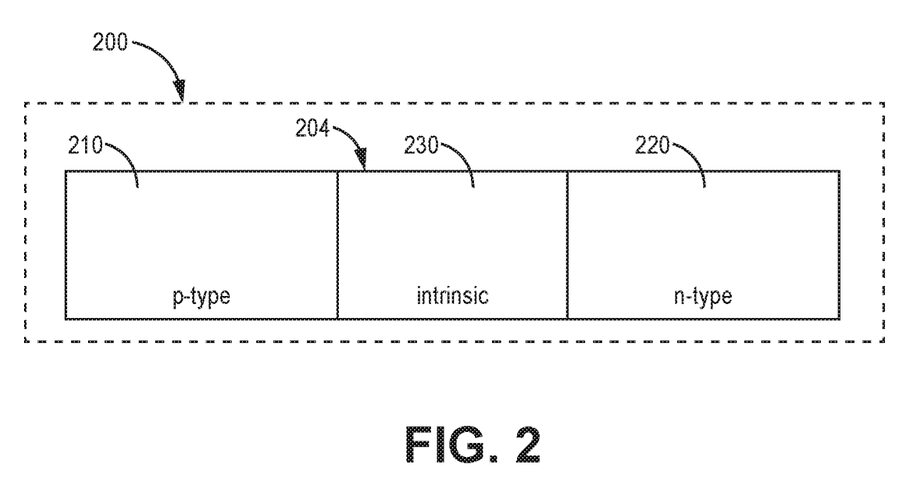
FIG. 2 is a schematic illustration of a diode structure, according to one embodiment, which can be implemented in the magnetometer device of FIG. 1.

FIG. 2 is a schematic illustration of a p-i-n diode structure 200, according to one example embodiment, which can be implemented in the present magnetometer device device. The p-i-n diode structure 200 includes a diamond substrate 204 with NV centers. A p-type region 210 is formed in one portion of diamond substrate 204, and an n-type region 220 is formed in another portion of diamond substrate 204. The remaining portion of diamond substrate 204 includes a high purity intrinsic diamond region 230, located between p-type region 210 and n-type region 220.

The p-i-n diode structure 200 can be formed using standard microfabrication techniques. The diamond substrate 204 can be doped with an acceptor dopant material such as boron. This forms p-type region 210 in diamond substrate 204. The diamond substrate 204 can also be doped with a donor dopant material such as phosphorous. This forms n-type region 220 in diamond substrate 204. The p-type region 210 and the n-type region 220 can be formed on either side of intrinsic diamond region 230.

In other embodiments, the diamond diode structure can be a p-n junction, a Schottky diode, or other transistor type devices as discussed further hereafter.

Figure 3:
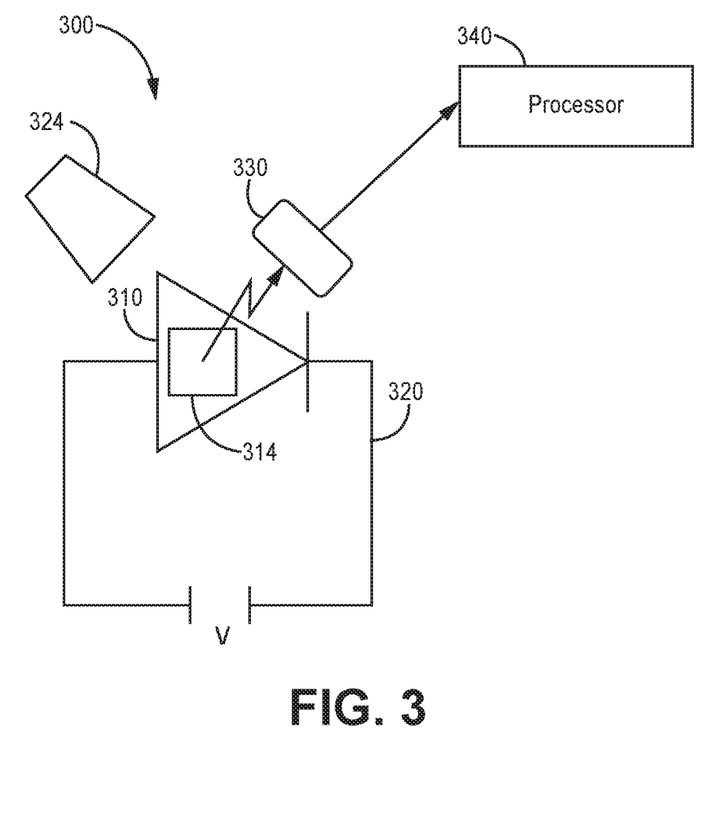
FIG. 3 is a schematic diagram of a magnetometer device, according to another embodiment.

FIG. 3 is a schematic diagram of a magnetometer device 300, according to another embodiment. The magnetometer device 300 comprises a diode structure 310 that includes a diamond material 314 having free electrons and free charge carriers. In one example embodiment, diode structure 310 includes a p-i-n diode structure, such as described above, in diamond material 314. An electrical circuit 320 is coupled to diode structure 310 and is operative to apply a forward bias voltage to diode structure 310.

The magnetometer device 300 also includes microwave device 324 operative to direct a microwave field to diode structure 310. The microwave device 324 is operative to direct a microwave field to diode structure 310 to drive transitions between magnetically sensitive spin levels, so that the magnetic field can be determined.

An optical detector 330, such as a photodetector, is operative to measure the electroluminescence produced by diode structure 310 after the forward bias voltage and microwave field are applied to diode structure 310. A processor 340 is coupled to optical detector 330 and is operative to determine a magnetic field based on the measured electroluminescence produced by diode structure 310.

During operation of magnetometer device 300, upon application of a forward bias voltage by electrical circuit 320, and a microwave field directed by microwave device 324, the charge carriers flow into a region of diode structure 310 where NV centers are located in diamond material 314. The optical detector 320 then collects electroluminescent photons that are emitted by diode structure 310. An electrical signal, corresponding to the electroluminescent photons, is the sent from optical detector 320 to processor 340 to determine the magnetic field at a particular location.

The emitted electroluminescence can be modified with the application of the microwave field. When the microwave frequency is on resonance with a m=0 to m=+/−1 state in the NV⁻ ground state manifold, population will be transferred out of the m=0 state. The hole capture process is dependent on the state of the electron in the defect center, and the electroluminescence will go down. Mapping the location of the m=+1 and m=−1 states allows for the measurement of the magnetic field as these have a Zeeman splitting of about 28 GHz/T.

Figure 4:
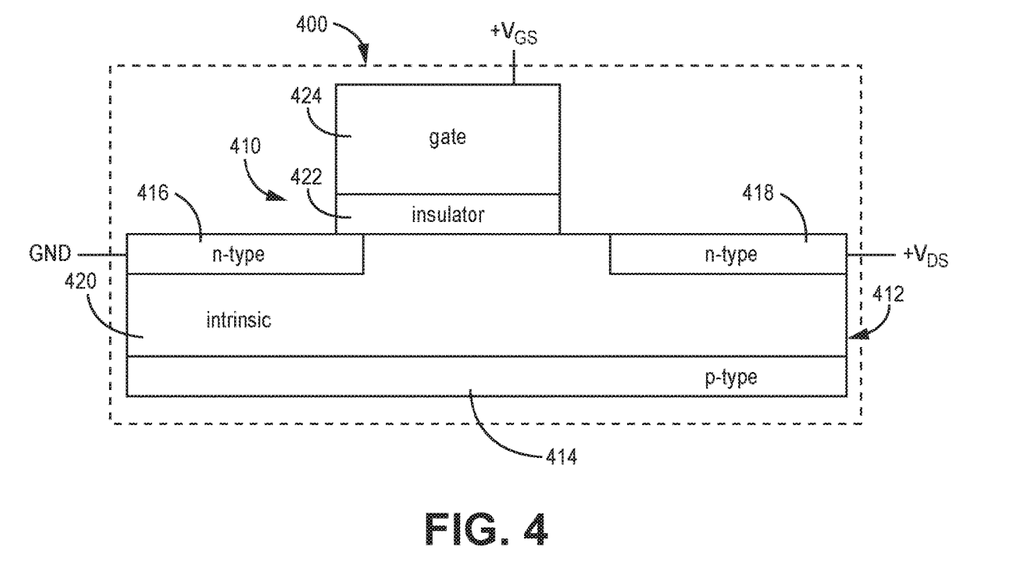
FIG. 4 is a schematic illustration of a diode structure, according to another embodiment, which can be implemented in the magnetometer device of FIG. 3.

FIG. 4 is a schematic illustration of a field effect transistor structure 400, according to another example embodiment, which can be implemented in the present magnetometer device. The field effect transistor structure 400 includes a metal-oxide-semiconductor field-effect transistor (MOSFET) structure 410, such as an n-type MOSFET.

The MOSFET structure 410 includes a diamond substrate 412 with NV centers. A p-type region 414 is formed in a lower side portion of diamond substrate 412. An n-type source 416 is formed on a first upper side portion of diamond substrate 412. An n-type drain 418 is formed on a second upper side portion of diamond substrate 412 that is separated from the first upper side portion. The remaining portion of diamond substrate 412 includes a high purity intrinsic diamond region 420. The intrinsic diamond region 420 is located between p-type region 414, and n-type source 416 and n-type drain 418. The intrinsic diamond region 420 also separates n-type source 416 from n-type drain 418.

An insulator layer 422, such as a metal oxide, is formed over a portion of an upper surface of diamond substrate 412, such that insulator layer 422 is in contact with n-type source 416. A gate electrode 424, such as a metal gate, is formed over insulator layer 422, such that gate electrode 424 is separated from diamond substrate 412 by insulator layer 422.

The gate electrode 424 is coupled to a gate-source voltage (+$V_{GS}$), and n-type drain 418 is coupled to a drain-source voltage (+$V_{DS}$). The n-type source 416 is coupled to ground (GND).

The MOSFET structure 410 can be formed using standard microfabrication techniques. The diamond substrate 412 can be doped with an acceptor dopant material such as boron. This forms p-type region 414 in diamond substrate 412. The diamond substrate 412 can also be doped with a donor dopant material such as phosphorous. This forms n-type source 416 and n-type drain 418 in diamond substrate 412. The insulator layer 422 can be formed by depositing a metal oxide or silicon dioxide on the upper surface of diamond substrate 412. The gate electrode 424 can be formed by depositing a metal material over insulator layer 422.

The MOSFET structure 410 enables hot carrier injection at large gate-drain biases, which results in impact ionization, increasing the density of charge carriers in intrinsic diamond region 420, where the NV centers are located. The gate-drain underlap in MOSFET structure 410 enables a large field in the NV diamond region without breaking down the gate dielectric.

It is known that diamond has strong compensation effects, which makes it challenging to generate sufficient charge carriers with just n-type and p-type doping. The impact ionization MOSFET can be used to increase the number of charge carriers in the diamond to increase sensitivity. Thus, in some embodiments, using a MOSFET structure in place of a p-i-n structure, in addition to the optical readout and applied microwave field, can enhance the sensitivity of the magnetometer device.

Figure 5:
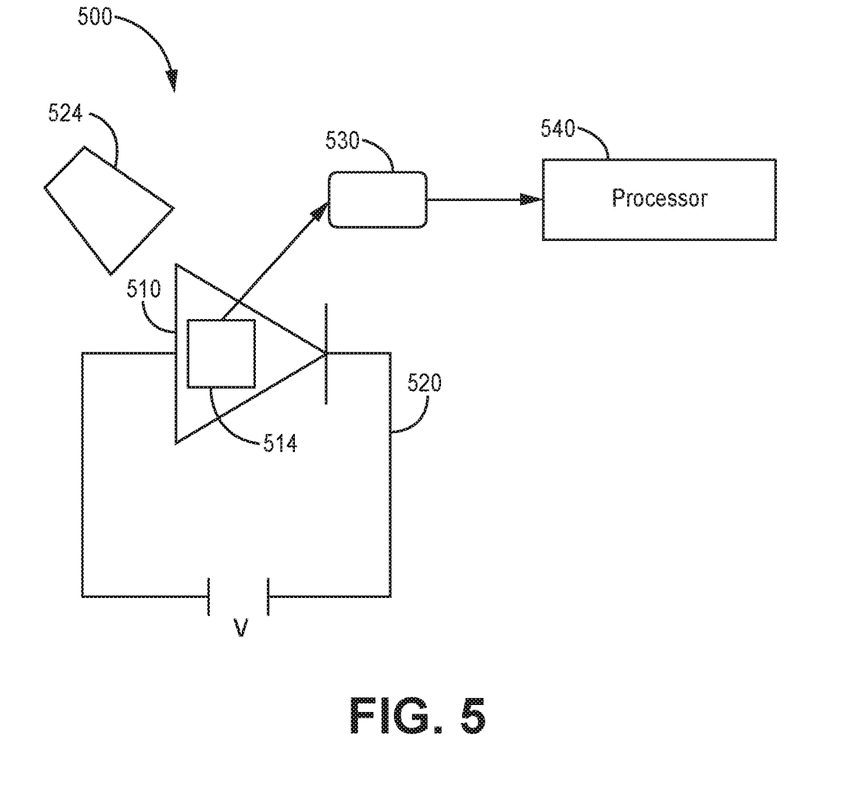
FIG. 5 is a schematic diagram of a magnetometer device, according to a further embodiment.

FIG. 5 is a schematic diagram of a magnetometer device 500, according to another embodiment. The magnetometer device 500 comprises a diode structure 510 that includes a diamond material 514 having free electrons and free charge carriers. As described further hereafter, diode structure 510 includes a bipolar junction transistor (BJT) structure in diamond material 514. An electrical circuit 520 is coupled to diode structure 510 and is operative to apply a forward bias voltage to diode structure 510. The magnetometer device 500 also includes microwave device 524 operative to direct a microwave field to diode structure 510.

An electrical detector 530, such as a current detector, is operative to measure a current produced by diode structure 510 after the forward bias voltage and microwave field are applied to diode structure 510. A processor 540 is coupled to electrical detector 530 and is operative to determine a magnetic field based on the measured current produced by diode structure 510.

During operation of magnetometer device 500, upon application of a forward bias voltage by electrical circuit 520 to diode structure 510, and a microwave field by microwave device 524, the charge carriers flow into a region of diode structure 510 where NV centers are located in diamond material 514. The current produced by diode structure 510 is measured using electrical detector 530. An electrical signal, corresponding to the measured current, is sent from electrical detector 530 to processor 540 to determine the magnetic field at a particular location. The BJT structure in diamond material 514 increases the signal to noise ratio of the electrical readout from electrical detector 530.

Figure 6:
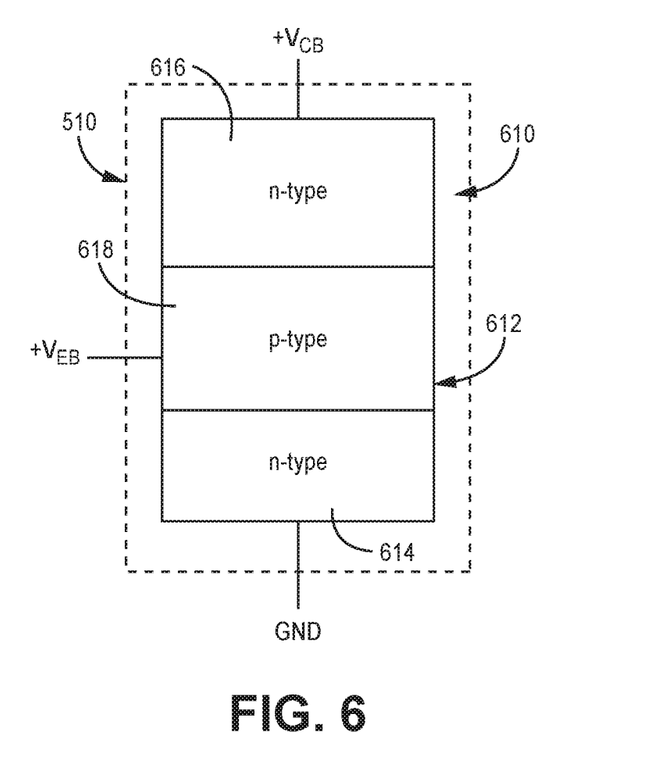
FIG. 6 is a schematic illustration of a diode structure, according to a further embodiment, which can be implemented in the magnetometer device of FIG. 5.

FIG. 6 is a schematic illustration showing further details of diode structure 510, which is implemented in magnetometer device 500 (FIG. 5). As shown in FIG. 6, diode structure 510 includes a bipolar junction transistor (BJT) structure 610. The BJT structure 610 includes a diamond substrate 612 with NV centers. An n-type emitter 614 is formed in one portion of diamond substrate 612. An n-type collector 616 is formed in another opposing portion of diamond substrate 612. The remaining portion of diamond substrate 612 includes a p-type base 618 with the NV centers, which is located between n-type emitter 614 and n-type collector 616.

The p-type base 618 is coupled to a emitter-base voltage ($+V_{EB}$), and n-type collector 616 is coupled to a collector-base voltage ($+V_{CB}$). The n-type emitter 614 is coupled to ground.

The BJT structure 610 can be formed using standard microfabrication techniques. The diamond substrate 612 can be doped with a donor material to form n-type emitter 614 and n-type collector 616. The diamond substrate 612 can also be doped with an acceptor material to form p-type base 618.

The BJT structure 610 is particularly applicable to implementations of the magnetometer where an electrical readout is employed, rather than an optical readout. When using such implementations, the microwave field is still applied, but the readout is done by monitoring the base current, not the electroluminescence.

In utilizing BJT structure 610, a small number of holes injected into p-type base 618 causes electrons from n-type emitter 614 to diffuse across p-type base 618, resulting in a drift current between p-type base 618 and n-type collector 616. The gain of the drift current (or common-emitter current gain $I_C/I_B$) is highly sensitive to the recombination in p-type base 618, which is the effect that is modulated by the pumping and microwave addressing that are ultimately used to sense the magnetic field. As such, this embodiment has the effect of having an amplifier built into the magnetometer device, which provides an improved signal to noise ratio.

In alternative embodiments, other measurement schemes can be utilized. For example, an absorptive measurement scheme can be employed where an absorptive probe beam, resonant with a transition in the NV diamond defect, is applied to the diamond material. The absorption is dependent on the population of the ground state, and thus, the magnetic field in the same way as described above.

Figure 7:
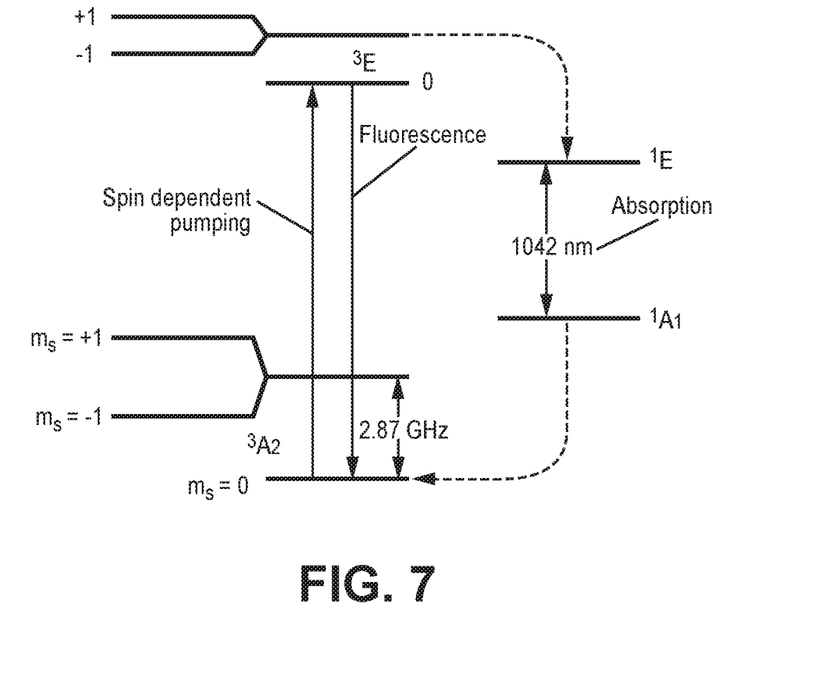
FIG. 7 is an energy level diagram for an example absorptive measurement scheme for a magnetometer device.

FIG. 7 is an energy level diagram for an example absorptive measurement scheme for a magnetometer device. In this example, NV diamond defects that are excited from the $m_s=0$ ground state with the spin dependent electrical pumping process have an alternate decay path to the $^1E$ level and subsequently to the metastable $^1A_1$ level, where their population will collect. If an absorptive probe beam, which in some instantiations may be at 1042 nm, passes through the magnetically sensitive portion of the diamond material, either freely propagating in the bulk crystal, or in a fabricated waveguide, then the probe beam will be absorbed by the defect centers in the $^1A_1$ level and the probe beam intensity will be lowered. If a microwave is resonant with the $m_s=0$ to $m_s=+/-1$ transitions, then the absorption of the probe beam will be decreased and the magnetic field can be determined.

Example Embodiments

Example 1 includes a magnetometer, comprising: a diode structure comprising a diamond material having free electrons and free charge carriers; an electrical circuit coupled to the diode structure and operative to apply a forward bias voltage to the diode structure; an optical detector operative to collect and measure an electroluminescence produced by the diode structure after the forward bias voltage is applied to the diode structure; and a processor coupled to the optical detector and operative to determine a magnetic field based on the measured electroluminescence produced by the diode structure.

Example 2 includes the magnetometer of Example 1, further comprising: a microwave device operative to direct a microwave field to the diode structure; wherein the optical detector is operative to measure the electroluminescence produced by the diode structure after the forward bias voltage is applied to the diode structure, and after the microwave field is directed to the diode structure.

Example 3 includes the magnetometer of any of Examples 1-2, wherein the diode structure incudes a p-i-n diode structure that includes a diamond substrate with nitrogen-vacancy (NV) centers.

Example 4 includes the magnetometer of Example 3, wherein the p-i-n diode structure comprises: a p-type region in one portion of the diamond substrate; an n-type region in another portion of the diamond substrate; and an intrinsic diamond region between the p-type region and the n-type region.

Example 5 includes the magnetometer of Example 4, wherein the p-type region comprises an acceptor dopant material in the diamond substrate, the acceptor dopant material comprising boron.

Example 6 includes the magnetometer of any of Examples 4-5, wherein the n-type region comprises a donor dopant material in the diamond substrate, the donor dopant material comprising phosphorous.

Example 7 includes the magnetometer of Example 1, wherein the diode structure incudes a metal-oxide-semiconductor field-effect transistor (MOSFET) structure.

Example 8 includes the magnetometer of Example 7, wherein the MOSFET structure comprises: a diamond substrate with nitrogen-vacancy (NV) centers; a p-type region in a lower side portion of the diamond substrate; an n-type source on a first upper side portion of the diamond substrate; an n-type drain on a second upper side portion of the diamond substrate that is separated from the first upper side portion; an intrinsic diamond region between the p-type region, and the n-type source and the n-type drain, wherein the intrinsic diamond region also separates the n-type source from the n-type drain; an insulator layer over a portion of an upper surface of the diamond substrate, wherein the insulator layer is in contact with the n-type source; and a gate layer over the insulator layer, wherein the gate layer is separated from the diamond substrate by the insulator layer.

Example 9 includes the magnetometer of Example 8, wherein: the gate layer is coupled to a gate-source voltage ($+V_{GS}$); the n-type drain is coupled to a drain-source voltage ($+V_{DS}$); and the n-type source is coupled to ground.

Example 10 includes the magnetometer of any of Examples 8-9, wherein the p-type region comprises an acceptor dopant material in the diamond substrate, the acceptor dopant material comprising boron.

Example 11 includes the magnetometer of any of Examples 8-10, wherein the n-type source and the n-type drain each comprise a donor dopant material in the diamond substrate, the donor dopant material comprising phosphorous.

Example 12 includes the magnetometer of any of Examples 8-11, wherein: the insulator layer comprises a metal oxide or silicon dioxide; and the gate layer comprises a metal.

Example 13 includes a method of operating the magnetometer of Example 1, the method comprising: applying the forward bias voltage to the diode structure such that the free charge carriers flow into an intrinsic region of the diamond material; collecting electroluminescent photons, emitted by the diode structure, in the optical detector; sending an electrical signal, corresponding to the electroluminescent photons, from the optical detector to the processor to determine the magnetic field at a particular location.

Example 14 includes the method of Example 13, further comprising: directing a microwave field to the diode structure when applying the forward bias voltage to the diode structure.

Example 15 includes a magnetometer, comprising: a diode structure comprising a diamond material having free electrons and free charge carriers; an electrical circuit coupled to the diode structure and operative to apply a forward bias voltage to the diode structure; a microwave device operative to direct a microwave field to the diode structure; an electrical detector operative to measure a current produced by the diode structure after applying the forward bias voltage to the diode structure, and after directing the microwave field to the diode structure; and a processor operative to determine a magnetic field based on the measured current produced by the diode structure.

Example 16 includes the magnetometer of Example 15, wherein the diode structure incudes a bipolar junction transistor (BJT) structure.

Example 17 includes the magnetometer of Example 16, wherein the BJT structure comprises: a diamond substrate with nitrogen-vacancy (NV) centers; an n-type emitter in one portion of the diamond substrate; an n-type collector in another portion of the diamond substrate; and a p-type base with the NV centers, wherein the p-type base is located between the n-type source and the n-type collector.

Example 18 includes the magnetometer of Example 17, wherein: the p-type base is coupled to an emitter-base voltage ($+V_{EB}$); the n-type collector is coupled to a collector-base voltage ($+V_{CB}$); and the n-type emitter is coupled to ground.

Example 19 includes a method of operating the magnetometer of Example 15, the method comprising: applying the forward bias voltage to the diode structure, such that the free charge carriers flow into a region of the diode structure where NV centers are located in the diamond material; directing the microwave field from the microwave device to the diode structure; measuring a current produced by the diode structure using the electrical detector; and sending an electrical signal, corresponding to the measured current, from the electrical detector to the processor to determine the magnetic field at a particular location.

Example 20 includes a method comprising: applying a forward bias voltage to a diode structure comprising a diamond material having free electrons and free charge carriers, such that the free charge carriers flow into an intrinsic region of the diamond material where nitrogen-vacancy (NV) centers are located; directing a microwave field to the diode structure; applying an absorptive probe beam to the intrinsic region of the diamond material, the absorptive probe beam resonant with a transition in the NV centers; and determining a magnetic field at a particular location based on a decrease in absorption of the absorptive probe beam; wherein the absorption of the absorptive probe beam is dependent on a ground state population.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A magnetometer, comprising:
    a diode structure comprising a diamond material having free electrons and free charge carriers;
    an electrical circuit coupled to the diode structure and operative to apply a forward bias voltage to the diode structure;
    an optical detector operative to collect and measure an electroluminescence produced by the diode structure after the forward bias voltage is applied to the diode structure; and
    a processor coupled to the optical detector and operative to determine a magnetic field based on the measured electroluminescence produced by the diode structure.

2. The magnetometer of claim 1, further comprising:
    a microwave device operative to direct a microwave field to the diode structure;
    wherein the optical detector is operative to measure the electroluminescence produced by the diode structure after the forward bias voltage is applied to the diode structure, and after the microwave field is directed to the diode structure.

3. The magnetometer of claim 1, wherein the diode structure incudes a p-i-n diode structure that includes a diamond substrate with nitrogen-vacancy (NV) centers.

4. The magnetometer of claim 3, wherein the p-i-n diode structure comprises:
    a p-type region in one portion of the diamond substrate;
    an n-type region in another portion of the diamond substrate; and
    an intrinsic diamond region between the p-type region and the n-type region.

5. The magnetometer of claim 4, wherein the p-type region comprises an acceptor dopant material in the diamond substrate, the acceptor dopant material comprising boron.

6. The magnetometer of claim 4, wherein the n-type region comprises a donor dopant material in the diamond substrate, the donor dopant material comprising phosphorous.

7. The magnetometer of claim 1, wherein the diode structure incudes a metal-oxide-semiconductor field-effect transistor (MOSFET) structure.

8. The magnetometer of claim 7, wherein the MOSFET structure comprises:
a diamond substrate with nitrogen-vacancy (NV) centers;
a p-type region in a lower side portion of the diamond substrate;
an n-type source on a first upper side portion of the diamond substrate;
an n-type drain on a second upper side portion of the diamond substrate that is separated from the first upper side portion;
an intrinsic diamond region between the p-type region, and the n-type source and the n-type drain, wherein the intrinsic diamond region also separates the n-type source from the n-type drain;
an insulator layer over a portion of an upper surface of the diamond substrate, wherein the insulator layer is in contact with the n-type source; and
a gate layer over the insulator layer, wherein the gate layer is separated from the diamond substrate by the insulator layer.

9. The magnetometer of claim 8, wherein:
the gate layer is coupled to a gate-source voltage $(+V_{GS})$;
the n-type drain is coupled to a drain-source voltage $(+V_{DS})$; and
the n-type source is coupled to ground.

10. The magnetometer of claim 8, wherein the p-type region comprises an acceptor dopant material in the diamond substrate, the acceptor dopant material comprising boron.

11. The magnetometer of claim 8, wherein the n-type source and the n-type drain each comprise a donor dopant material in the diamond substrate, the donor dopant material comprising phosphorous.

12. The magnetometer of claim 8, wherein:
the insulator layer comprises a metal oxide or silicon dioxide; and
the gate layer comprises a metal.

13. A method of operating the magnetometer of claim 1, the method comprising:
applying the forward bias voltage to the diode structure such that the free charge carriers flow into an intrinsic region of the diamond material;
collecting electroluminescent photons, emitted by the diode structure, in the optical detector; and
sending an electrical signal, corresponding to the electroluminescent photons, from the optical detector to the processor to determine the magnetic field at a particular location.

14. The method of claim 13, further comprising:
directing a microwave field to the diode structure when applying the forward bias voltage to the diode structure.

15. A magnetometer, comprising:
a diode structure comprising a diamond material having free electrons and free charge carriers;
an electrical circuit coupled to the diode structure and operative to apply a forward bias voltage to the diode structure;
a microwave device operative to direct a microwave field to the diode structure;
an electrical detector operative to measure a current produced by the diode structure after applying the forward bias voltage to the diode structure, and after directing the microwave field to the diode structure; and
a processor operative to determine a magnetic field based on the measured current produced by the diode structure.

16. The magnetometer of claim 15, wherein the diode structure incudes a bipolar junction transistor (BJT) structure.

17. The magnetometer of claim 16, wherein the BJT structure comprises:
a diamond substrate with nitrogen-vacancy (NV) centers;
an n-type emitter in one portion of the diamond substrate;
an n-type collector in another portion of the diamond substrate; and
a p-type base with the NV centers, wherein the p-type base is located between the n-type emitter and the n-type collector.

18. The magnetometer of claim 17, wherein:
the p-type base is coupled to a emitter-base voltage $(+V_{EB})$;
the n-type collector is coupled to a collector-base voltage $(+V_{CB})$; and
the n-type emitter is coupled to ground.

19. A method of operating the magnetometer of claim 15, the method comprising:
applying the forward bias voltage to the diode structure, such that the free charge carriers flow into a region of the diode structure where NV centers are located in the diamond material;
directing the microwave field from the microwave device to the diode structure;
measuring a current produced by the diode structure using the electrical detector; and
sending an electrical signal, corresponding to the measured current, from the electrical detector to the processor to determine the magnetic field at a particular location.

20. A method comprising:
applying a forward bias voltage to a diode structure comprising a diamond material having free electrons and free charge carriers, such that the free charge carriers flow into an intrinsic region of the diamond material where nitrogen-vacancy (NV) centers are located;
directing a microwave field to the diode structure;
applying an absorptive probe beam to the intrinsic region of the diamond material, the absorptive probe beam resonant with a transition in the NV centers; and
determining a magnetic field at a particular location based on a decrease in absorption of the absorptive probe beam;
wherein the absorption of the absorptive probe beam is dependent on a ground state population.

* * * * *